United States Patent
Kim et al.

(10) Patent No.: US 9,753,197 B2
(45) Date of Patent: Sep. 5, 2017

(54) IDENTIFICATION FILM AND PATTERN INCLUDING PHOTONIC CRYSTALS AND ANTICOUNTERFEITING PRODUCT INCLUDING THE SAME

(71) Applicants: Korea Advanced Institute of Science and Technology, Daejeon (KR); Eui Joung Hong, Daejeon (KR)

(72) Inventors: Shin Hyun Kim, Daejeon (KR); Seung Man Yang, Daejeon (KR); Hye Soo Lee, Daejeon (KR); Tae Soup Shim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 574 days.

(21) Appl. No.: 14/328,994

(22) Filed: Jul. 11, 2014

(65) Prior Publication Data
US 2015/0076808 A1 Mar. 19, 2015

(30) Foreign Application Priority Data
Sep. 17, 2013 (KR) .......................... 10-2013-0111602

(51) Int. Cl.
*B42D 25/36* (2014.01)
*B42D 25/41* (2014.01)
(Continued)

(52) U.S. Cl.
CPC ................ *G02B 5/26* (2013.01); *B32B 27/08* (2013.01); *B32B 27/20* (2013.01); *B42D 25/36* (2014.10);
(Continued)

(58) Field of Classification Search
CPC ........ B42D 25/36; B42D 25/41; G02B 5/206; G02B 5/26; G03F 7/20; G03F 7/26;
(Continued)

(56) References Cited

U.S. PATENT DOCUMENTS

| | | | | |
|---|---|---|---|---|
| 2004/0146811 A1* | 7/2004 | Yang | ...................... | B82Y 20/00 430/322 |
| 2012/0064309 A1* | 3/2012 | Kwon | .................... | B82Y 20/00 428/195.1 |
| 2013/0146788 A1* | 6/2013 | Yin | ........................ | B82Y 20/00 250/492.1 |

FOREIGN PATENT DOCUMENTS

KR  10-2007-0099838 A  10/2007
KR  10-2010-0065597 A  6/2010

OTHER PUBLICATIONS

Office Action dated Jul. 16, 2014, issued in counterpart Korean Application No. 10-2013-0111602, with English translation. (4 pages).

* cited by examiner

*Primary Examiner* — John A McPherson
(74) *Attorney, Agent, or Firm* — Westerman, Hattori, Daniels & Adrian, LLP (57) ABSTRACT

An identification film and pattern having high transparency and a reflectance spectrum with respect to a particular wavelength and including photonic crystals patterned into a particular shape and an anticounterfeiting product including the same are disclosed. A highly transparent colloidal photonic crystal film is easily manufactured using photocurable colloidal suspensions. Even though a plurality of patterns (including sub-patterns) is formed in plural films, there is no reduction in optical characteristics such as transparency, reflectance spectra, and the like. Thus, a film patterned into a desired shape is manufactured and thus usability thereof is (Continued)

enhanced, and a plurality of reflectance spectra with various wavelength ranges is provided and thus identification capability or security is enhanced.

12 Claims, 10 Drawing Sheets

(51) Int. Cl.
*G02B 5/26* (2006.01)
*G02B 1/00* (2006.01)
*G02B 5/20* (2006.01)
*B32B 27/08* (2006.01)
*B32B 27/20* (2006.01)
*G03F 7/00* (2006.01)
*G03F 7/027* (2006.01)

(52) U.S. Cl.
CPC ............ *B42D 25/41* (2014.10); *G02B 1/005* (2013.01); *G02B 5/206* (2013.01); *G03F 7/0002* (2013.01); *G03F 7/0012* (2013.01); *G03F 7/027* (2013.01); *B32B 2264/025* (2013.01); *B32B 2264/0235* (2013.01); *B32B 2264/102* (2013.01); *B32B 2307/404* (2013.01); *B32B 2307/416* (2013.01); *B32B 2425/00* (2013.01)

(58) Field of Classification Search
CPC ...... G03F 7/0005; G03F 7/2002; G03F 7/027; G03F 7/105
USPC ............................................. 430/321; 283/85
See application file for complete search history.

IDENTIFICATION FILM AND PATTERN INCLUDING PHOTONIC CRYSTALS AND ANTICOUNTERFEITING PRODUCT INCLUDING THE SAME

BACKGROUND OF THE INVENTION

Field of the Invention

The present invention relates to an identification film and pattern including photonic crystals and an anticounterfeiting product including the same and more particularly to an identification film and pattern having high transparency and reflectance spectra with respect to particular wavelengths and including photonic crystals patterned into a particular shape and an anticounterfeiting product including the same.

Description of the Related Art

Photonic crystals are materials with photonic bandgaps by periodic changes in dielectric constant at half the wavelength of light. In this regard, photons with energy corresponding to photonic bandgaps cannot propagate into photonic crystals due to very low state density of photonic crystals and, when a photonic bandgap is present in a visible light region, this immediately appears a reflection color.

Regular arrays of colloidal particles exhibit a reflection color by the same principle and the reflection color corresponds to the bandgap of photonic crystals. The reflection color of colloidal photonic crystals is determined by indexes of refraction, crystal structures, particle sizes, interparticle spaces and the like of colloids and the surrounding materials. Thus, photonic crystals with a desired reflection color may be prepared by controlling these properties.

Film-type photonic crystals are mainly formed by vertical coating and spin-coating. Vertical coating may be used to prepare a thick film having high reflectance (P. Jiang, J. F. Bertone, K. S. Hwang, and V. L. Colvin, "Single-Crystal Colloidal Multilayers of Controlled Thickness", Chemistry of Materials, 11, 2132-2140 (1999)). However, the prepared thick film has very weak mechanical strength in terms of structure and is easy to break and is prepared by an evaporation process, which results in increased manufacturing time. In addition, there are many cracks in colloidal crystals prepared by vertical coating and thus it is difficult to practically apply such colloidal crystals.

In spin coating (Journal of American Chemical Society, 126, 13778-13786 (2006); U.S. Patent Publication No.: 2005/0095471), crystals may be rapidly prepared, but it is difficult to prepare thick crystals with high reflectance and to adjust lattice constant and thus it is difficult to realize various reflection colors using particles having the same size, and it is difficult to re-coat another material with such crystals after production due to large crystal size.

To address the above-described problems, the inventors of the present invention proposed a paint composition pigment including photonic crystals having high reflectance and showing various reflection colors and a method of preparing the same, disclosed in Korean Patent Publication No.: 10-2010-40527. The patent application discloses a method of preparing a film by dispersing colloids in a monomer resin and photo-curing the resultant material. However, there is still a need to develop a technology for applying the paint composition to a variety of fields. For example, there is a need to develop a method of further enhancing identification capability, security, convenience in terms of use, and the like of the paint composition of the disclosed patent.

SUMMARY OF THE INVENTION

Therefore, the present invention has been made in view of the above problems, and it is an object of the present invention to provide a method of easily manufacturing a highly transparent colloidal photonic crystal film using a photocurable colloidal suspension.

It is another object of the present invention to provide an identification film with enhanced identification capability, security and convenience of use.

It is another object of the present invention to provide an identification film or pattern having a predetermined shape that may be applied to a variety of security products.

It is a further object of the present invention to provide an identification film or pattern that may provide various structural colors and a plurality of reflectance spectra.

In accordance with an aspect of the present invention, the above and other objects can be accomplished by the provision of an identification film including a pattern region formed by curing through self-assembly of colloidal particles dispersed in a monomer resin and comprising a pattern having a predetermined shape and a binding region surrounding and supporting the pattern region and formed by curing of a monomer resin, wherein the pattern region has a reflectance spectrum with respect to a particular wavelength.

In accordance with another aspect of the present invention, there is provided an identification pattern including a photonic crystal pattern having a predetermined shape cured by self-assembly of colloidal particles dispersed in a monomer resin, wherein the photonic crystal pattern has a reflectance spectrum with respect to a particular wavelength and the monomer resin and the colloidal particles have the same index of refraction or a difference of 0.2 or less in index of refraction.

In accordance with another aspect of the present invention, there is provided an anticounterfeiting product including an object article needing to be identified and the above-described identification pattern or film formed on the object article and exhibiting a reflectance spectrum with respect to a particular wavelength.

In accordance with a further aspect of the present invention, there is provided a method of manufacturing an identification film, including preparing a pattern region by injecting a colloidal dispersion in which colloidal particles are dispersed in a photocurable monomer resin between two parallel flat plates, positioning a mask pattern having a predetermined shape on the flat plates, photocuring the colloidal dispersion, and removing a portion of the colloidal dispersion having not been photocured and preparing a binding region by injecting a photocurable monomer resin or a photocurable colloidal dispersion into a region from which the non-photocured portion has been removed, followed by photocuring.

In accordance with a further aspect of the present invention, there is provided a method of manufacturing an identification pattern, including injecting a colloidal dispersion in which colloidal particles are dispersed in a photocurable monomer resin into two parallel flat plates, positioning a mask pattern having a predetermined shape on the flat plates, photocuring the colloidal dispersion, and removing a portion of the colloidal dispersion having not been photocured.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention relates to an identification film and pattern having a reflectance spectrum with respect to a particular wavelength. Hereinafter, embodiments of the present invention will be described in detail with reference to the accompanying drawings.

Figure 1:
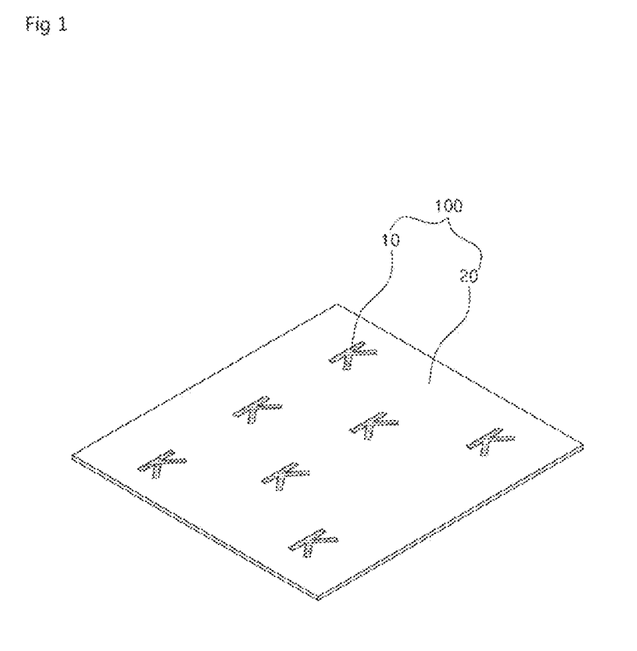
FIG. 1 is an identification film according to an embodiment of the present invention.
Figure 2:
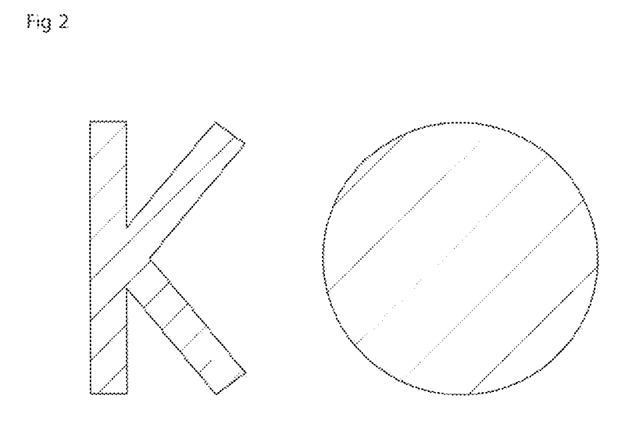
FIG. 2 is a view illustrating an identification pattern according to an embodiment of the present invention.

FIG. 1 is an identification film according to an embodiment of the present invention. FIG. 2 is a view illustrating an identification pattern according to an embodiment of the present invention.

Referring to FIG. 1, the identification film according to the present embodiment includes a pattern region 10 and a binding region 20.

The pattern region 10 is formed by curing through self-assembly of colloidal particles dispersed in a monomer resin and has patterns with a predetermined shape.

The monomer resin containing self-assembled colloidal crystals in the pattern region is cured by polymerization.

The pattern region 10 represents a region in which colloidal particles form crystals and thus have a reflectance spectrum at a specific wavelength. For example, as illustrated in FIG. 1, the pattern region 10 may include a plurality of particular characters. In addition, the pattern region 10 may be a region in which particular characters or numbers, drawings, or colloidal particles including all or each thereof form photonic crystals.

The pattern region 10 may be formed using various methods. Preferably, the pattern region 10 may be formed by photolithography using a photomask having a predetermined shape (e.g., intaglio shape).

The colloidal particles may be selected from among silica, titanium dioxide, polystyrene, or polymethylmethacrylate. In addition, the colloidal particles may have a size of 50 nm to 100,000 nm, more preferably 100 nm to 3,000 nm. In addition, the colloidal particles may be particles having a hollow structure or a core-shell structure.

The monomer resin in which the colloidal particles are dispersed is a photocurable monomer and may be a monomer resin having an acrylate group such as ethoxylated trimethylolpropane triacrylate. Preferably, the monomer resin having the same index of refraction as that of the colloidal particles or having a difference of 0.2 or less, more preferably 0.05 or less, from that of the colloidal particles may be used. When the difference between the indexes of refraction of the colloidal particles and the monomer resin is as small as the above-described range, van der Walls attraction between the colloidal particles decreases and thus repulsive force between the particles becomes relatively strong. As a result, the colloidal particles are aligned so as to have a regular crystal structure to minimize repulsive energy. In addition, when the difference between the indexes of refraction of the colloidal particles and the polymer is as small as the above-described range, light may easily pass through a film in a wavelength region excluding reflective wavelengths and thus a photonic crystal film with high transparency may be formed.

The colloidal particles may be dispersed in the monomer resin as a dispersion medium in an amount of 50% (v/v) or less, preferably 10% to 40% (v/v). When the amount of the colloidal particles is within the above-described range, colloidal photonic crystals may be formed by repulsive force between the colloidal particles.

The film may be manufactured by further dispersing, in the monomer resin, at least one material selected from among a fluorescent material, a quantum dot, carbon black, carbon nanotubes, and titanium dioxide and photocuring the resulting dispersion.

The binding region 20 surrounds and supports the pattern region 10.

The binding region 20 may be a transparent polymer film excluding colloidal particles. That is, the binding region 20 may be formed by photocuring a monomer resin excluding colloidal particles. The monomer resin constituting the binding region 20 may be the same monomer resin as that used to form the pattern region 10.

Meanwhile, a colloidal crystals-containing monomer material may be used as a binder. That is, a film that forms photonic crystals through self-assembly of the colloidal particles dispersed in the monomer resin may be used as the binder. In this case, the colloidal particles used in the pattern region 10 and the colloidal particles used in the binding region 20 represent reflectance spectra with different wavelengths.

The identification film may have a thickness of 5 μm to 500 μm.

In the identification film, the pattern region 10 having a predetermined shape may be easily formed into a film by the binding region 20 and thus may be variously applied to particular products that require identification or security.

Figure 3:
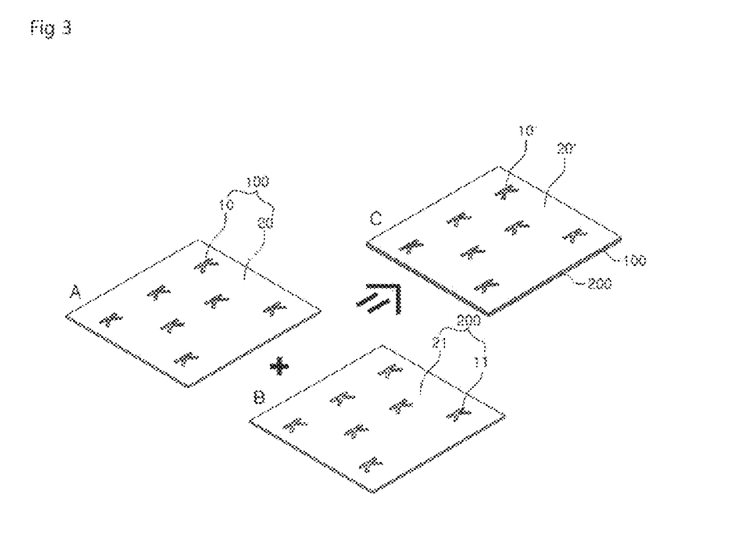
FIG. 3 is a view illustrating an identification film formed such that a plurality of films stacked as multiple layers is patterned into a single shape.

The identification film may be formed as multiple patterned layers. FIG. 3 is a view illustrating an identification film formed such that a plurality of films 100 and 200 stacked is patterned into a single shape.

The identification film may be formed by patterning a plurality of films stacked into a single shape. Referring to FIG. 3, pattern regions 10 and 11 are patterned into the same shape. When the two films 100 and 200 are put together, the pattern regions 10 and 11 overlap each other. Colloidal particles constituting the pattern region 10 (particle size: 178 nm and green) and the pattern region 11 (particle size: 146 nm and blue) have different sizes and thus the films 100 and 200 have different reflective wavelengths.

The multilayer patterned identification film has a plurality of reflectance spectra with different wavelengths.

The multilayer patterned identification film exhibits a synthesized structural color by color mixing of the respective layers.

The multilayer patterned identification film may be manufactured using other methods in addition to the method illustrated in FIG. 3. This will be described below.

Figure 4:
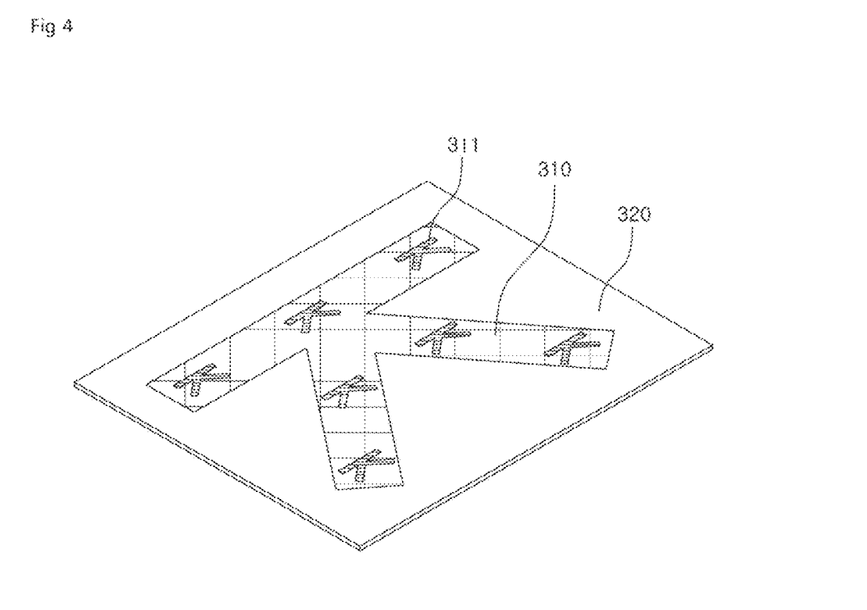
FIG. 4 is a view illustrating an identification film including sub-patterns in a pattern region.

FIG. 4 is a view illustrating an identification film including sub-patterns in a pattern region 310. Referring to FIG. 4, the identification film includes the pattern region 310 and a binding region 320.

The pattern region 310 includes one or more sub-patterns 311 with different reflective wavelengths.

The sub-patterns 311 exhibit different structural colors than that of the pattern region 310.

Photonic crystals-forming colloidal particles of the pattern region 310 and photonic crystals-forming colloidal particles of the sub-patterns 311 have different sizes.

In the sub-pattern 311, a second sub-pattern (not shown) and a third sub-pattern (not shown) that have different reflectance spectra may be further formed.

The identification film may have a plurality of reflectance spectra with different wavelength regions and thus may enhance security or identification capabilities. In addition, the identification film may have multicolored patterns having various shapes and thus it is easy to apply the identification film to a variety of products or objects.

The present invention also provides an identification pattern. The identification pattern is illustrated in FIG. 2.

For a description of the identification pattern, reference may be made to the content of the identification film (colloidal particles, polymer by the monomer resin, manufacturing method, and the like). However, there is a difference between the identification pattern and the identification film in that the identification pattern represents patterned characters, figures, drawings, and the like existing only as a pattern region without presence of a binding region.

The identification pattern is a photonic crystal pattern having a predetermined shape that is cured by self-assembly of colloidal particles dispersed in a monomer resin.

The photonic crystal pattern has a reflectance spectrum with respect to a particular wavelength.

The monomer material and the colloidal particles, constituting the identification pattern, may have the same index of refraction or a difference of 0.2 or less in index of refraction.

Figure 5:
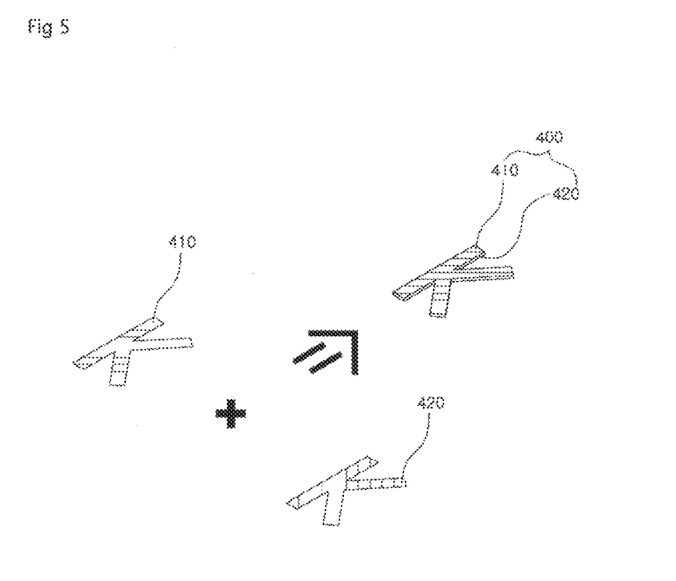
FIG. 5 illustrates that a plurality of identification patterns is stacked.

FIG. 5 illustrates that a plurality of identification patterns is stacked. Referring to FIG. 5, an identification pattern 400 is formed such that photonic crystal patterns 410 and 420 having the same shape are stacked.

The identification pattern 400 has a plurality of reflectance spectra with different wavelengths. The identification pattern 400 has a synthesized structural color by color mixing of the respective layers.

Figure 6:
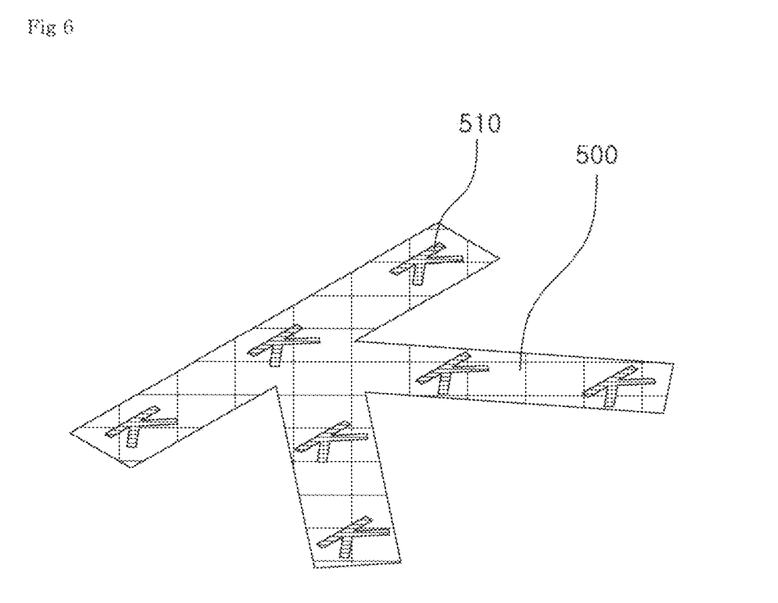
FIG. 6 is a view of an identification pattern having at least one sub-pattern.

FIG. 6 is a view of an identification pattern 500 having at least one sub-pattern. Referring to FIG. 6, the identification pattern 500 includes one or more sub-patterns 510 having different reflective wavelengths.

The one or more sub-patterns 510 have different structural colors than that of the identification pattern 500.

Colloidal particles of the sub-patterns 510 and colloidal particles of the identification pattern 500 have different sizes.

In the sub-patterns 510, a second sub-pattern (not shown) and a third sub-pattern (not shown) that have different reflectance spectra may be further formed.

According to another embodiment of the present invention, there is provided a method of manufacturing the identification film.

Figure 7:
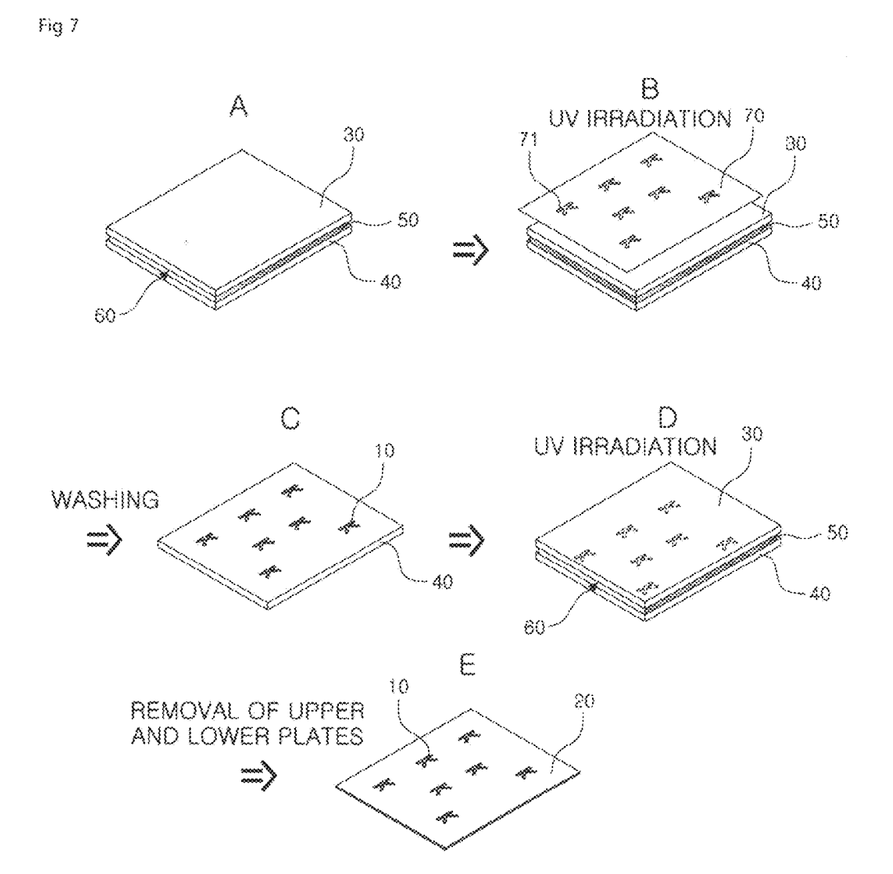
FIG. 7 is a view sequentially illustrating an identification film fabrication method according to an embodiment of the present invention.

FIG. 7 is a view sequentially illustrating an identification film fabrication method according to an embodiment of the present invention. Referring to FIG. 7, the identification film fabrication method includes preparing a pattern region and preparing a binding region.

The preparing of the pattern region includes injecting a colloidal dispersion 60 in which colloidal particles are dispersed in a photocurable monomer resin between two parallel flat plates 30 and 40 (see A of FIG. 7), positioning a mask pattern 70 having a predetermined shape on the flat plates 30 and 40 and photocuring the colloidal dispersion 60 (see B of FIG. 7), and removing a portion of the colloidal dispersion 60 that has not been photocured (see C of FIG. 7). In C of FIG. 7, the pattern region 10 formed on the flat plate 40 remains.

In this regard, when the flat plate 40 is removed, the pattern region 10 may be obtained as an independent structure. In this case, the pattern region 10 is the identification pattern illustrated in FIG. 2.

A distance between the two flat plates 30 and 40 may be 5 μm to 500 μm, and a spacer 50 is disposed between the plates 30 and 40 to maintain the distance.

The mask pattern 70 has predetermined patterns 71 formed as an intaglio.

After the process illustrated in C of FIG. 7, the flat plate 30 is disposed on the flat plate 40. In this case, a spacer is used to maintain a predetermined distance between the two flat plates 30 and 40. Subsequently, a photocurable monomer resin 80 is injected between the flat plates 30 and 40 and photocured (see D of FIG. 7), and the two flat plates 30 and 40 are removed (see E of FIG. 7). Colloidal particles are not dispersed in the photocurable monomer resin 80. The identification film manufactured using the above-described method is illustrated in FIG. 1 and E of FIG. 7.

The photocurable colloidal dispersion may be photocured through irradiation with ultraviolet light at about 14 mW/cm$^2$ for 0.01 to 10 seconds. To completely photocure the photocurable colloidal dispersion including monomers, emission intensity or time of the ultraviolet light may vary. In this regard, wavelength of the ultraviolet light may be the same as an absorption wavelength of a photoinitiator used, and ultraviolet light having a wide wavelength range generated from a mercury arc lamp or the like may be typically used.

According to the present invention, the multilayer patterned identification film or identification pattern 400 may be fabricated (see FIGS. 3 and 5).

Referring to FIG. 3, a multilayer identification film may be manufactured by manufacturing a plurality of identification films as illustrated in FIG. 1 and combining the identification films. In this regard, the identification films may be manufactured respectively using different sizes of colloidal particles injected when forming the identification films, under the same conditions, for example, using the same pattern shape and the like.

In addition, after fabrication of the identification film of FIG. 1, the flat plate 30 is removed, a spacer is again disposed on the flat plate 40, the resulting structure is covered by the flat plate 30, and a colloidal dispersion (using colloidal particles having a different size than that of the colloidal particles used in FIG. 1) is injected between the flat plates 30 and 40. Subsequently, the mask used in FIG. 1 is positioned on the flat plate 30, followed by photocuring, and a portion of the colloidal dispersion that has not been photocured is removed. When the flat plate 30 is removed, consequently, another pattern region may be formed on the pattern region 10 of the identification film 100.

Next, the flat plate 30 is again disposed on the flat panel 40 and the photocurable monomer resin 80 is injected between the flat plates 30 and 40, followed by photocuring (see D of FIG. 7). When the flat plates 30 and 40 are removed, the multilayer patterned identification film as illustrated in C of FIG. 3 may be manufactured.

The multilayer identification pattern may be prepared using various methods. For example, as illustrated in FIG. 3, the multilayer identification film may be manufactured by manufacturing a plurality of identification films as illustrated in FIG. 1 and combining the identification films. In this regard, the identification films may be manufactured respectively using different sizes of colloidal particles injected when forming the identification films, under the same conditions, for example, using the same pattern shape and the like.

In addition, after the process illustrated in C of FIG. 7, the resulting structure is covered by the flat plate 30 (a spacer is disposed so as to maintain a greater distance than that between the flat plates 30 and 40 illustrated in A of FIG. 7), and a colloidal dispersion (including a different size of colloidal particles than that of the colloidal dispersion 60 of FIG. 7) is injected therebetween, followed by photocuring using a mask 70. Thereafter, an uncured portion of the colloidal dispersion is removed and the flat plates 30 and 40 are removed, thereby obtaining a double layer identification pattern.

According to the present invention, an identification film (see FIG. 4) or pattern (see FIG. 6) having one or more sub-patterns may be manufactured. The colloidal particles, injected in preparation of a sub-pattern region and preparation of a pattern region, have different sizes.

Figure 8:
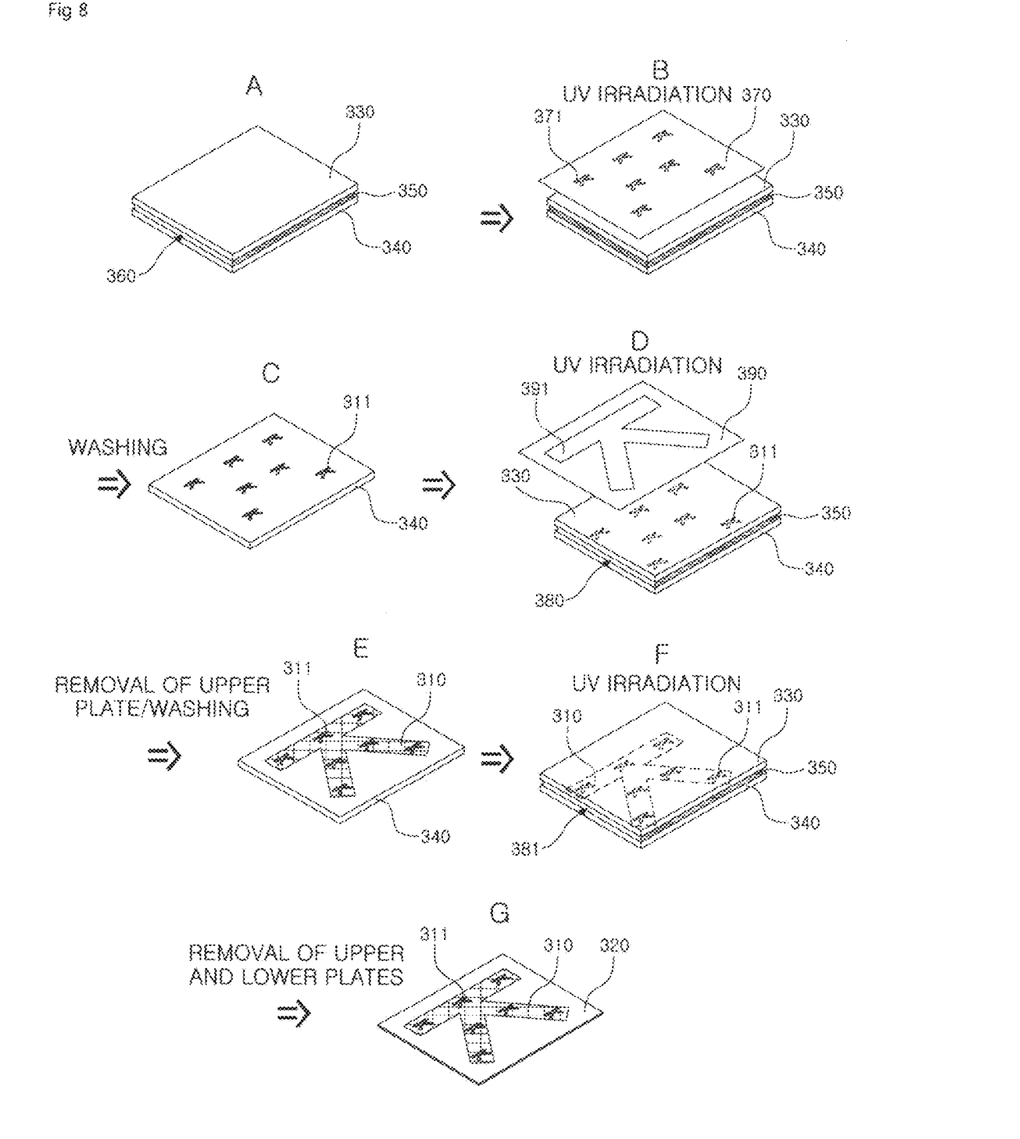
FIG. 8 illustrates a method of manufacturing an identification film having one or more sub-patterns.

FIG. 8 illustrates a method of manufacturing an identification film having one or more sub-patterns. According to the method, a pattern region 311 may be formed and thereafter one or more sub-patterns may be formed thereon or the one or more sub-patterns may be formed and thereafter the pattern region 311 including the sub-patterns may be formed, and then the binding region may be formed.

First, a colloidal dispersion 360 in which colloidal particles are dispersed in a photocurable monomer resin is injected between two parallel flat plates 330 and 340 (see A of FIG. 8), a mask pattern 370 having a predetermined shape is positioned on the flat plate 330, followed by photocuring (see B of FIG. 8), and a portion of the colloidal dispersion 360 that has not been photocured is removed. In C of FIG. 8, the pattern region 311 formed on the flat plate 340 remains.

A distance between the two flat plates 330 and 340 may be 5 μm to 500 μm, and a spacer 350 is disposed between the flat plates 330 and 340 so as to maintain the distance. The mask pattern 370 has predetermined patterns 371 formed as an intaglio. The patterns 371 may be sub-patterns.

After the process illustrated in C of FIG. 8, the flat plate 330 is disposed on the flat plate 340. In this case, a spacer is used to maintain a predetermined distance (the same or greater than that illustrated in A of FIG. 8) between the two flat plates 330 and 340. Subsequently, a photocurable colloidal dispersion 380 (including a different size of colloidal particles than that of the colloidal dispersion 360 illustrated in A of FIG. 8) is injected between the flat plates 330 and 340 and a mask pattern 390 having a predetermined shape is positioned on the flat plate 330, followed by photocuring (see D of FIG. 8), and the flat plates 330 and 340 are removed (see E of FIG. 8). An exposed region 391 (intaglio) of the mask pattern 390 may include the sub-patterns 371. A region photocured by the exposed region 391 forms a pattern 310.

After the process illustrated in E of FIG. 8, the flat plate 330 is disposed on the flat plate 340. In this regard, a spacer is used to maintain a predetermined distance (the same or greater than that illustrated in D of FIG. 8) between the flat plates 330 and 340. A photocurable monomer resin 381 (in which colloidal particles are not dispersed) is injected between the flat plates 330 and 340 and photocured (see F of FIG. 8), and the flat plates 330 and 340 are removed (see G of FIG. 8). Meanwhile, in FIGS. 7 and 8, a monomer resin with colloidal particles dispersed therein may be injected when preparing the binding region 20 or 320.

The identification pattern having at least one sub-pattern of FIG. 6 may be obtained by forming the sub-patterns 311 and forming the identification pattern 310 including the sub-patterns 311. In another embodiment, the identification pattern having at least one sub-pattern of FIG. 6 may be prepared by forming the identification pattern 310 and forming the sub-patterns 311 thereon.

For a description of the identification pattern preparation method, reference may be made to the content described above with reference to FIG. 8.

The colloidal particles injected in preparation of the sub-patterns and the colloidal particles injected in preparation of the identification pattern have different sizes.

The mask pattern used in preparation of the identification pattern may include patterns formed in the preparation of the sub-patterns.

According to another embodiment of the present invention, there is provided an anticounterfeiting product.

The anticounterfeiting product includes the identification film or pattern described above.

More particularly, the anticounterfeiting product includes an object article that needs to be identified; and an identification pattern or film that is formed on the object article and has a reflectance spectrum with respect to a particular wavelength.

The object article may be bills, securities, an official document, a certificate, an identification card, or a financial card.

The identification film or the identification pattern may be attached to the object article using a known lamination method.

An attachment layer may be formed between the object article and the identification film/identification pattern. The attachment layer may be formed of a polymer material with high transparency and good adhesion without limitation. For example, the polymer material may be polyester, nylon, polyimide, polysiloxane, polypropylene, or the like.

For a description of the identification pattern or the identification film, the reference may be made to the content described above.

The identification pattern is an independent photonic crystal pattern having a particular shape that is cured by self-assembly of colloidal particles dispersed in the monomer resin.

The identification film includes a pattern region cured by self-assembly of colloidal particles dispersed in the monomer resin material and a binding region that surrounds and supports the pattern region and is formed by curing of the monomer resin, and the pattern region has a reflectance spectrum with respect to a particular wavelength.

The monomer resin and the colloidal particles have the same index of refraction or a difference of 0.2 or less in index of refraction.

The identification film is formed such that plural films stacked as multiple layers are patterned into a single shape, and the identification films have a plurality of reflectance spectra with different wavelength ranges. The identification films may exhibit a synthesized structural color. The pattern region may include one or more sub-patterns having reflectance spectra with different reflective wavelengths. The sub-patterns may exhibit a different structural color than that of the pattern region.

The identification pattern may be formed such that plural photonic crystal patterns having the same shape are stacked and have a plurality of reflectance spectra with different reflective wavelength ranges. The identification pattern may exhibit a synthesized structural color. The identification pattern may include one or more sub-patterns having reflectance spectra of different wavelength ranges.

Hereinafter, embodiments of the present invention will be described in further detail with reference to the following examples. These examples are provided for illustrative purposes only and are not intended to limit the scope of the invention.

Example 1

Manufacture of Identification Film

Silica particles having a uniform size of 180 nm prepared using a Stöber-Fink-Bohn method were dispersed in ethoxylated trimethylolpropane triacrylate (ETPTA) in a volume fraction of 0.33, and 2-hydroxy-2-methyl-1-phenyl-1-propanone (Darocur 1173 available from Ciba Chemical) as a photoinitiator was added thereto to prepare a silica dispersion. Subsequently, the silica dispersion was introduced into a space between two glass plates spaced 50 μm apart using capillary force and a photomask (see FIG. 7) with the letter k was positioned on the resulting structure_Thereafter, ultraviolet light generated from a mercury arc lamp was emitted at a luminous intensity of 14 mW/cm² to the photomask for 10 seconds to cure the silica dispersion and then an uncured portion of the silica dispersion was removed.

Subsequently, the resulting structure was covered by a glass plate and a photocurable monomer resin (excluding colloidal particles) was injected between the plates to fill a space in the vicinity of the photocured k pattern. Thereafter, ultraviolet light was again emitted thereto to photocure the photocurable monomer resin to manufacture an identification film, and the identification film was separated from the glass plate. The obtained identification film is illustrated in FIG. 9.

Figure 9:
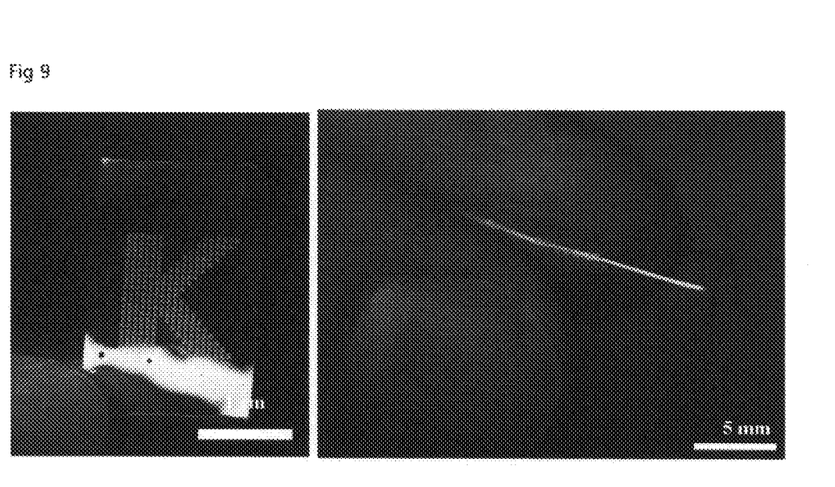
FIG. 9 is an image of an identification film manufactured according to Example 1.

Referring to FIG. 9, the identification film is a flexible film having patterned photonic crystals and high transparency.

Figure 10:
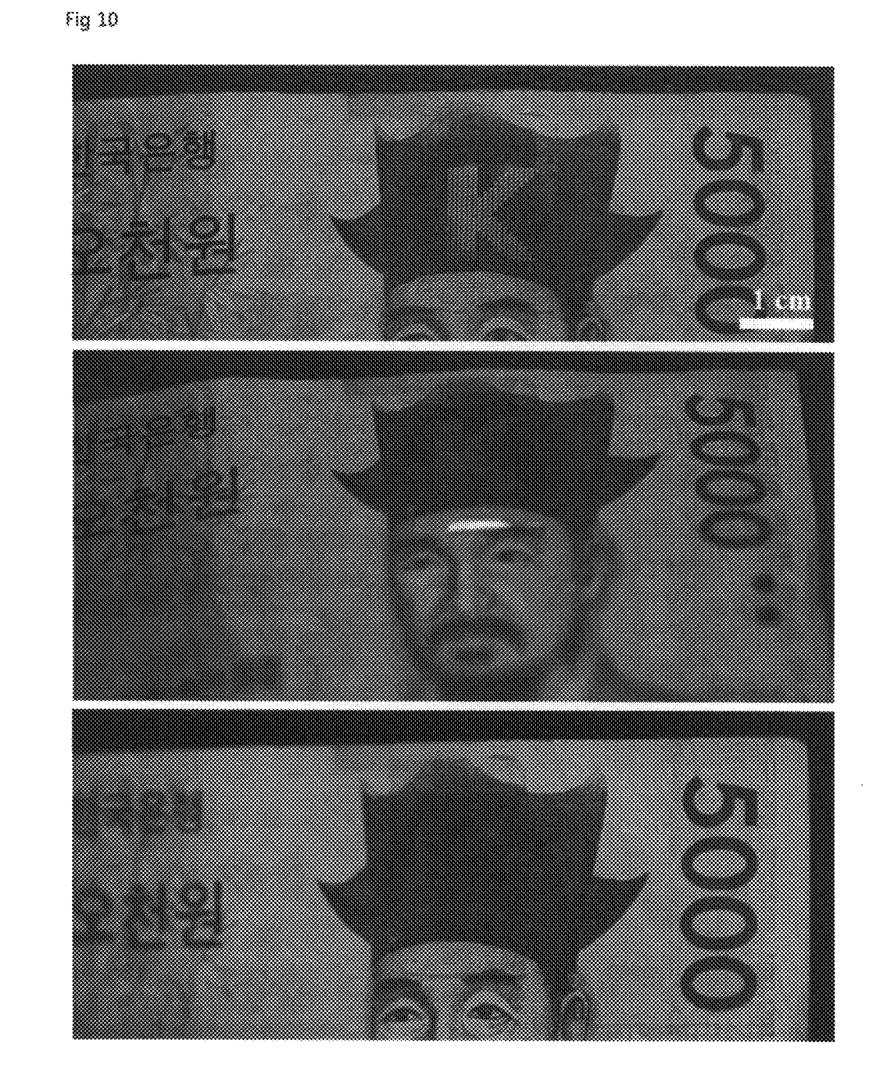
FIG. 10 illustrates images showing a bill to which the identification film of FIG. 9 is attached.

FIG. 10 illustrates three three-dimensional (3D) images showing a bill to which the identification film of FIG. 9 is attached. Referring to FIG. 10, when the angle of incidence and viewing angle of light coincide with each other, a clear photonic crystal color is exhibited. In this regard, when the angle of incidence and viewing angle of light are small (i.e., close to vertical incidence), the identification film appears green, which is a photonic crystal color (see the top image of FIG. 10). When the angle of incidence and viewing angle of light are big, a reflection color is shifted towards short wavelengths and thus the identification film appears blue (see the middle image of FIG. 10). Meanwhile, when the angle of incidence and viewing angle of light are different, the photonic crystal identification film does not exhibit a reflection color (see the bottom image of FIG. 10). In this regard, due to high transparency of the identification film, it is difficult to see whether or not the identification film is disposed on the bill with the naked eye.

Examples 2 and 3

Silica particles having a uniform size of 180 nm prepared using a Stöber-Fink-Bohn method were dispersed in ETPTA in a volume fraction of 0.33, and 2-hydroxy-2-methyl-1-phenyl-1-propanone (Darocur 1173 available from Ciba Chemical) as a photoinitiator was added thereto to prepare a silica dispersion. Subsequently, the silica dispersion was introduced into a space between two glass plates spaced 50 μm apart using capillary force. Thereafter, a photomask (see FIG. 7) with a lowercase k as an intaglio was positioned on the resulting structure, ultraviolet light generated from a mercury arc lamp was emitted at a luminous intensity of 14 mW/cm² to the photomask for 10 seconds to cure the silica dispersion, and then an uncured portion of the silica dispersion was removed.

Subsequently, the resulting structure was covered by a glass plate and a photocurable silica dispersion (size and volume fraction of silica are 205 nm and 0.33) was injected between the plates (spaced 100 μm apart) to fill a space in the vicinity of the photocured k pattern. Thereafter, a photomask with an uppercase K formed as an intaglio was positioned on the glass plate (see FIG. 8) and ultraviolet light was emitted thereto to photocure the photocurable silica dispersion.

Subsequently, Examples 2 and 3 below were separately performed.

Example 2

Figure 11:
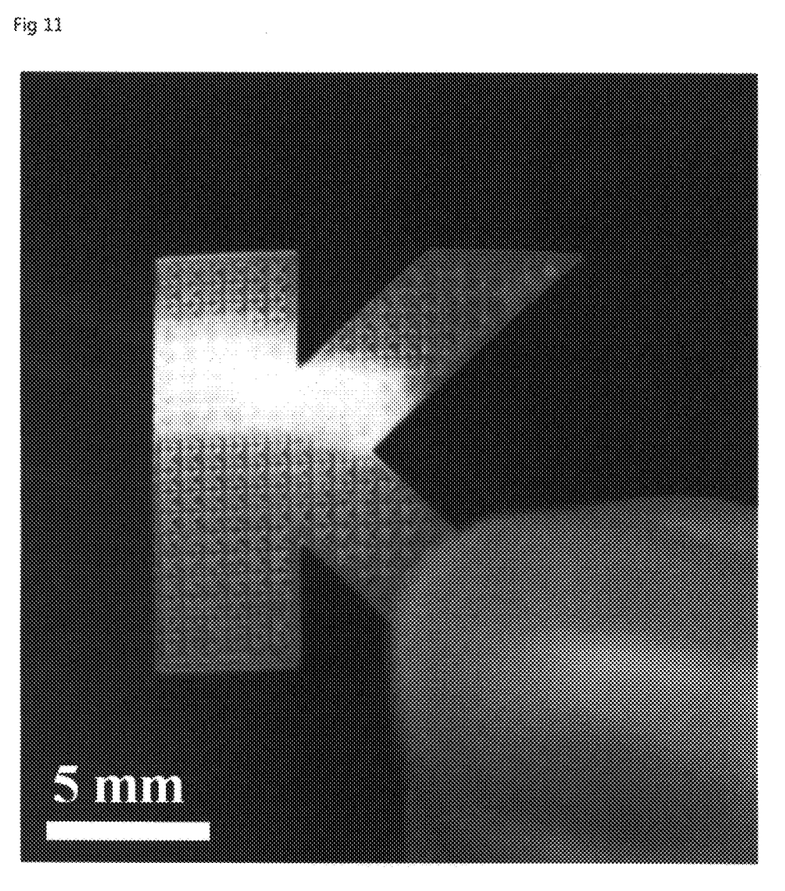
FIG. 11 is an image of an identification pattern formed according to Example 2 having sub-patterns.

An uncured portion of the dispersion was washed and the glass plates were removed to obtain an identification pattern including sub-patterns (see FIG. 11).

Example 3

An uncured portion of the dispersion was washed. The resulting structure was covered by a glass plate and a photocurable colloidal dispersion (particle size and volume fraction of silica were 155 nm and 0.33) was injected between the plates (spaced 150 μm apart) to fill a space in the vicinity of the photocured large K pattern. Thereafter, ultraviolet light was again emitted thereto to photocure the monomer resin to obtain an identification film and the identification film was separated from the glass plates. The obtained identification film is illustrated in FIG. 12.

The identification pattern of FIG. 11 includes green-colored small ks as sub-patterns and a red-colored large K as a pattern.

Figure 12:
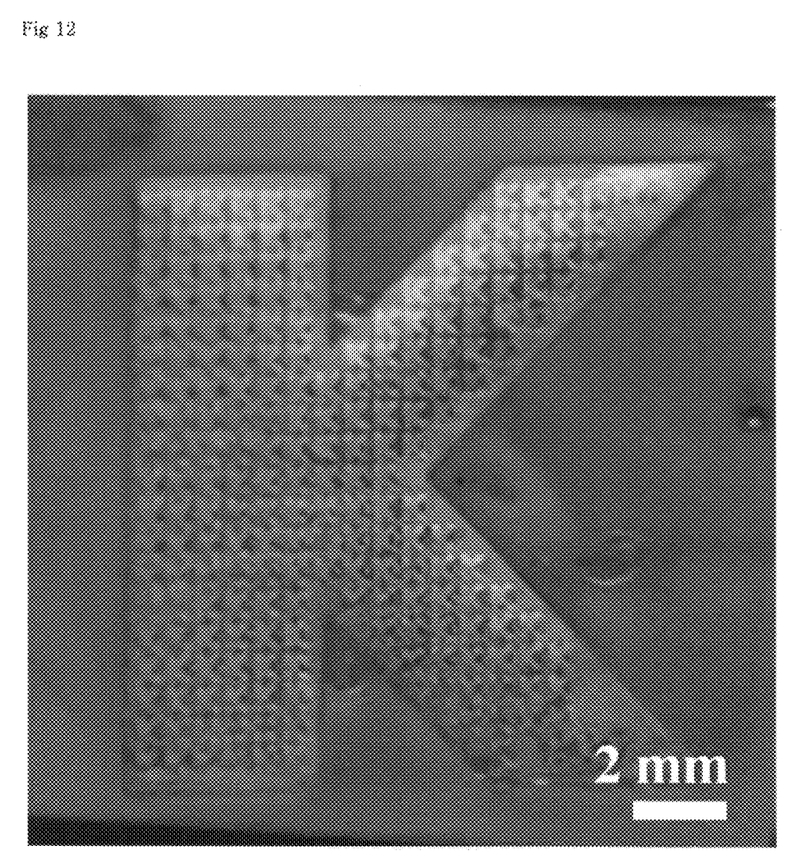
FIG. 12 is an image of an identification film manufactured according to Example 3.

The identification film of FIG. 12 is a film obtained using green-colored small ks as sub-patterns, a red-colored large K, and silica colloids exhibiting a blue background color in a binding region.

Figure 13:
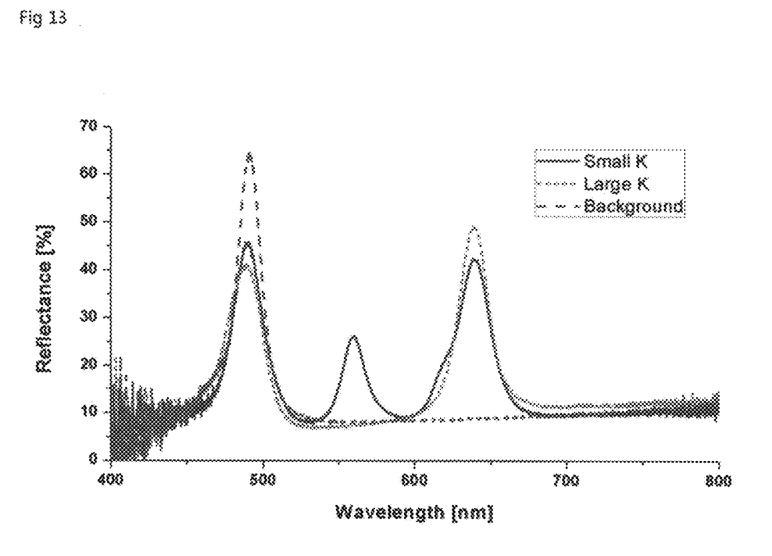
FIG. 13 is a graph showing reflectance spectra according to positions of the small k, large K and background as a binding region of the identification film of FIG. 12.
Figure 14:
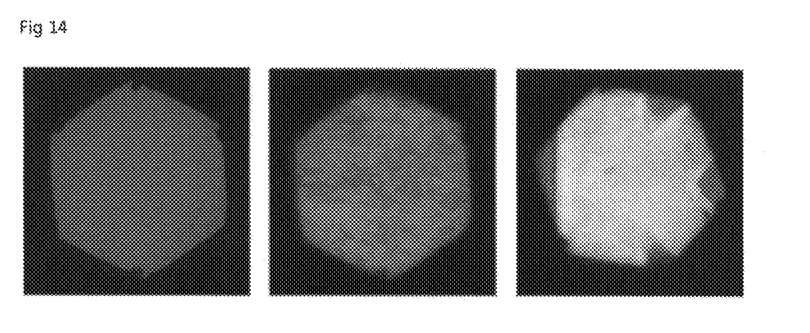
FIG. 14 illustrates optical microscope images of the identification film of FIG. 12 (only partial images).

FIG. 13 is a graph showing reflectance spectra according to positions of the small k, large K and the binding region as a background of the identification film of FIG. 12. FIG. 14 illustrates optical microscope images (partially taken) of the identification film of FIG. 12.

Referring to FIGS. 12 to 14, the small k patterns are formed through crystallization of silica colloids exhibiting green. In addition, the red-colored large K is formed on the small k patterns and the blue-colored binding region is formed thereon. Thus, in the small k pattern region, three distinguishable reflectance spectrum peaks are present and an observed optical image appears white, which is a mixture of green, blue, and red.

In addition, since the blue-colored binding region is formed on the red-colored large K pattern, two distinguishable reflectance spectrum peaks are present in the large K pattern region and an observed optical image appears magenta, which is a mixture of blue and red.

In addition, it can be confirmed that the blue-colored binding region having a thickness of 150 µm has a single peak and appears blue.

As described above, a highly transparent colloidal photonic crystal film may be easily manufactured using a photocurable colloidal suspension.

According to the present invention, even though a plurality of patterns (including sub-patterns) is formed in plural films, there is no reduction in optical characteristics such as transparency, reflectance spectra, and the like. Thus, films may be manufactured using patterns having a desired shape and thus usability thereof is enhanced, and a plurality of reflectance spectra with various wavelength ranges may be provided and thus identification capability or security may be enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An identification film comprising:
    a pattern region formed by selective curing of monomer resin containing self-assembled colloidal crystals and comprising a pattern having a predetermined shape; and
    a binding region to surround and support the pattern region,
    wherein the pattern region has a reflectance spectrum with respect to a particular wavelength,
    wherein the identification film is formed such that a plurality of films stacked as multiple layers is patterned into a single shape, and
    wherein the multilayer identification films exhibit a synthesized structural color by color mixing of the respective layers and have a plurality of reflectance spectra with different wavelength ranges.

2. The identification film according to claim 1, wherein the pattern region and the binding region exhibit reflectance spectra with different wavelength ranges when the monomer resin in the binding region is cured or the monomer resin containing self-assembled colloidal crystals in the pattern region is cured by polymerization.

3. The identification film according to claim 1, wherein the monomer resin and the colloidal particles have the same index of refraction or a difference of 0.2 or less in index of refraction.

4. The identification film according to claim 1, wherein the pattern region comprises one or more sub-patterns having reflectance spectra with different reflective wavelength ranges.

5. The identification film according to claim 4, wherein the sub-patterns exhibit different structural colors than that of the pattern region.

6. The identification film according to claim 1, wherein the colloidal particles are selected from the group consisting of silica, titanium dioxide, polystyrene, and polymethylmethacrylate.

7. An anticounterfeiting product comprising:
    an object article needing to be identified; and
    the identification pattern or film according to claim 1 formed on the object article and exhibiting a reflectance spectrum with respect to a particular wavelength.

8. The anticounterfeiting product according to claim 7, wherein the object article is a bill, securities, an official document, a certificate, an identification card, or a financial card.

9. An identification pattern comprising a photonic crystal pattern having a predetermined shape formed by curing monomer resin containing self-assembled colloidal crystals,
    wherein the photonic crystal pattern has a reflectance spectrum with respect to a particular wavelength,
    wherein the monomer resin and the colloidal particles have the same index of refraction or a difference of 0.2 or less in index of refraction, and
    wherein the identification pattern is formed by stacking of a plurality of photonic crystal patterns having the same shape as multiple layers to have a plurality of reflectance spectra with different reflective wavelength ranges and exhibits a synthesized structural color by color mixing of the respective layers.

10. The identification pattern according to claim 9, wherein the identification pattern comprises one or more sub-patterns having reflectance spectra with different wavelength ranges.

11. A method of manufacturing an identification film, the method comprising:
    preparing a pattern region by injecting a colloidal dispersion in which colloidal particles are dispersed in a photocurable monomer between two parallel flat plates,
    positioning a mask pattern having a predetermined shape on the flat plates, photocuring the colloidal dispersion, and removing a portion of the colloidal dispersion having not been photocured; and
    preparing a binding region by injecting a photocurable monomer or a photocurable colloidal dispersion into a region from which the non-photocured portion has been removed, followed by photocuring,
    wherein colloidal particles injected in the preparing of the pattern region and colloidal particles injected in the preparing of the binding region have different sizes, and
    wherein the method is performed such that a plurality of identification films is manufactured and adhered to one another to form multiple layers.

12. The method according to claim 11, wherein the method is performed by forming a pattern region and forming a sub-pattern thereon or by forming a sub-pattern and forming a pattern region comprising the sub-pattern, wherein colloidal particles injected in the forming of the sub-pattern and colloidal particles injected in the forming of the pattern region have different sizes.

* * * * *